(12) United States Patent
Mun et al.

(10) Patent No.: US 6,933,543 B2
(45) Date of Patent: Aug. 23, 2005

(54) COMPOUND SEMICONDUCTOR HIGH FREQUENCY SWITCH DEVICE

(75) Inventors: Jae Kyoung Mun, Daejeon (KR); Hong Gu Ji, Daejeon (KR); Hokyun Ahn, Daejeon (KR); Heacheon Kim, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/874,396

(22) Filed: Jun. 22, 2004

(65) Prior Publication Data

US 2005/0121694 A1    Jun. 9, 2005

(30) Foreign Application Priority Data

Dec. 5, 2003   (KR) ..................... 10-2003-0087994

(51) Int. Cl.[7] .......................................... H01L 29/739
(52) U.S. Cl. ...................... 257/194; 257/192; 257/183
(58) Field of Search ................................ 257/192, 194, 257/183, 187; 438/48, 60, 285, 590

(56) References Cited

FOREIGN PATENT DOCUMENTS

| | | |
|---|---|---|
| JP | 2001-210819 | 8/2001 |
| KR | 1020020090345 | 12/2002 |

OTHER PUBLICATIONS

"Low-Insertion-Loss DP3T MMIC Switch for Dual-Band Cellular Phones", A. Nagayama, et al., IEEE Journal of Solid-State Circuits, vol. 34, No. 8, Aug. 1999.

*Primary Examiner*—Eddie Lee
*Assistant Examiner*—Douglas W. Owens
(74) *Attorney, Agent, or Firm*—Blakely Sokoloff Taylor & Zafman

(57) ABSTRACT

A high frequency switch device includes an epitaxy substrate that is formed by sequentially stacking an AlGaAs/GaAs superlattic buffer layer, a first Si planar doping layer, an undoped first AlGaAs spacer, an undoped InGaAs layer, an undoped second AlGaAs spacer, a second Si planar doping layer having a doping density greater than that of the first Si planar doping layer, and an undoped GaAs/AlGaAs capping layer on a GaAs semi-insulated substrate. The undoped GaAs/AlGaAs capping layer is formed with a source electrode and a drain electrode that form an ohmic contact with the undoped GaAs/AlGaAs capping layer thereon, and a gate electrode formed between the source electrode and the drain electrode, thereby forming a Schottky contact with the undoped GaAs/AlGaAs capping layer.

13 Claims, 4 Drawing Sheets

COMPOUND SEMICONDUCTOR HIGH FREQUENCY SWITCH DEVICE

BACKGROUND OF THE INVENTION

This application claims the priority of Korean Patent Application No. 2003-87994, filed on Dec. 5, 2003, in the Korean Intellectual Property Office, the disclosure of which is incorporated herein in its entirety by reference.

1. Field of the Invention

The present invention relates to a compound semiconductor high frequency switch device that is a core element of a compound semiconductor switch Microwave Monolithic Integrated Circuit (MMIC) used for high frequency switching, and more particularly to a high frequency switch device which has high electric power, low insertion loss, high isolation and high switching speed characteristics.

2. Description of the Related Art

Mobile telecommunication equipment such as a mobile phone or wireless LAN generally utilizes microwave in a GHz band, and a switch device that converts high frequency signals by means of a conversion circuit of an antenna or a transmit-receive shifting switch is widely available. Switch devices adopt a High Electron Mobility Transistor (HEMT) that is a compound semiconductor transistor of offering favorable transmission characteristics in a high frequency band, or a Field Effect Transistor (FET) such as a MEtal-Semiconductor FET (MESFET). Especially, GaAs compound semiconductor FETs are frequently used and, accordingly, a MMIC in which a switch circuit itself is integrated in a GaAs substrate is being actively developed.

The high frequency switch circuit requires an insertion loss as small as possible while enhancing isolation, and more particularly, designing of a device serially connected to a signal path is important. A reason of using the GaAs FET as the high frequency switch device is in that GaAs with the higher electron mobility than Silicon (Si) involves small resistance, thereby lowering the loss. Furthermore, GaAs is a semi-insulated substrate, which is thus suitable for achieving high isolation between signal paths.

In order to make a resistance of a channel region of a transistor small as possible in a conventional high frequency switch device, the channel width was designed as wide as possible. By doing so, a surface area of the channel region is secured to thus decrease the insertion loss. However, the widened channel width increases a capacitance caused by a Schottky contact formed between a gate electrode and a channel region. Therefore, an input signal of the high frequency is leaked from the Schottky contact to thereby deteriorate the isolation. Conventionally, the above-stated isolation is improved by installing a shunt FET, which however increases a chip size and, in turn, increases cost.

SUMMARY OF THE INVENTION

The present invention provides a high frequency switch device of optimizing a structure of an epitaxy substrate, in which an insertion loss during the on-state is decreased and isolation during the off-state is increased.

According to an aspect of the present invention, there is provided a high frequency switch device, which includes an epitaxy substrate formed by sequentially stacking an AlGaAs/GaAs superlattic buffer layer, a first Si planar doping layer, an undoped first AlGaAs spacer, an undoped InGaAs layer, an undoped second AlGaAs spacer, a second Si planar doping layer having a doping density greater than that of the first Si planar doping layer, and an undoped GaAs/AlGaAs capping layer on a GaAs semi-insulated substrate. A source electrode and a drain electrode are formed on the undoped GaAs/AlGaAs capping layer, thereby forming an ohmic contact with the undoped GaAs/AlGaAs capping layer. A gate electrode is formed between the source electrode and the drain electrode, thereby forming a Schottky contact with the undoped GaAs/AlGaAs capping layer.

Preferably, the second Si planar doping layer has a doping density greater than the first Si planar doping layer by 4 times or greater. For example, it is preferable that a doping density of the second Si planar doping layer is $2 \times 10^{12}$ cm$^{-2}$~$8 \times 10^{12}$ cm$^{-2}$, and a doping density of the first Si planar doping layer is $0.5 \times 10^{12}$ cm$^{-2}$ ~$2.0 \times 10^{12}$ cm$^{-2}$. More preferably, a doping density in the second Si planar doping layer is approximately 4 times of that in the first Si planar doping layer. Also, the second AlGaAs spacer is thicker than the first AlGaAs spacer by twice or greater.

The gate electrode is preferably a T-type gate electrode. Furthermore, the distance between the gate electrode and the source electrode equals to a distance between the gate electrode and the drain electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
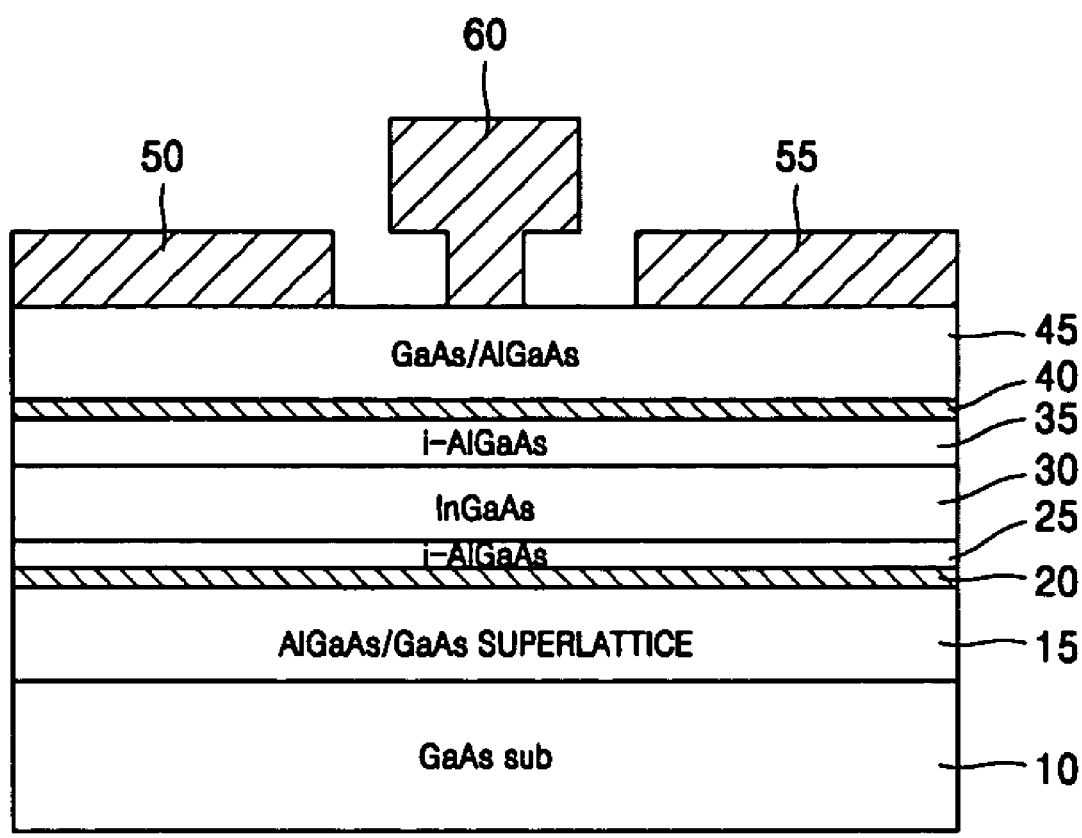
FIG. 1 is a sectional view showing a high frequency switch device according to the present invention.

FIG. 1 is a sectional view schematically showing a structure of a high frequency switch device according a preferred embodiment of the present invention. Here, an epitaxial structure should be optimized so that an average doping density of a channel layer is increased in order to decrease an insertion loss during an on-state, and a leakage current component of the channel layer and a capacitance of a Schottky contact are decreased in order to increase isolation during an off-state.

Referring to FIG. 1, the high frequency switch device according to the present invention includes an epitaxy substrate formed with an AlGaAs/GaAs superlattice buffer layer 15 on a GaAs semi-insulating substrate 10, and a first Si planar doping layer 20. Then, an undoped first AlGaAs spacer 25, an undoped InGaAs layer 30, an undoped second AlGaAs spacer 35, a second Si planar doping layer 40 with a doping density greater than that of the first Si planar doping layer 20, and an undoped GaAs/AlGaAs capping layer 45 are sequentially stacked.

The undoped GaAs/AlGaAs capping layer 45 is formed with a source electrode 50 and a drain electrode 55 thereon, which form an ohmic contact with the undoped GaAs/AlGaAs capping layer 45. A gate electrode 60 that forms a Schottky contact together with the undoped GaAs/AlGaAs capping layer 45 is formed between the source electrode 50 and the drain electrode 55.

In the high frequency switch device according to the present invention, the insertion loss during the on-state can be decreased by the increase of a sum of Si densities of the first and second Si planar doping layers 20 and 40, which in turn improves a power transfer characteristic per unit area. In order to decrease leakage current components and to increase a switching speed of the switch circuit under the off-state, the second Si planar doping layer 40 preferably has a doping density greater than that of the first Si planar doping layer 20 by 4 times or greater. By doing so, an intensity of an electric field applied to the gate electrode 60 during the off-state grows weaker as flowing along a depth direction of the channel layer. Accordingly, the doping density of the first Si planar doping layer 20 disposed on a portion deeper from the Schottky contact surface should be so low that a depletion region of the channel more quickly extends toward the AlGaAs/GaAs superlattice buffer layer 15 with respect to an equal gate voltage to increase the switching speed and to decrease the leakage current, thereby improving isolation characteristic of the switch circuit.

Therefore, the doping density of the second Si planar doping layer 40 should exceed that of the first Si planar doping layer 20 by 4 times or greater, which is determined by considering the decrease of the insertion loss during the on-state. For example, it is preferable to make the doping density of the second Si planar doping layer 40 be $2 \times 10^{12}$ cm$^{-2}$~$8 \times 10^{12}$ cm$^{-2}$, and that of the first Si planar doping layer 20 be $0.5 \times 10^{12}$ cm$^{-2}$~$2.0 \times 10^{12}$ cm$^{-2}$.

To optimize the epitaxy substrate structure, the second AlGaAs spacer 35 is preferably thicker than the first AlGaAs spacer 25 by twice and greater. Additionally, a breakdown voltage characteristic can be improved by forming the undoped GaAs/AlGaAs capping layer 45.

The AlGaAs/GaAs superlattice buffer layer 15 may be formed of an AlGaAs layer of 20~50 Å and a GaAs layer of 20~50 Å, which are repeated by 20~50 periods. The layers are formed in such a manner that the first AlGaAs spacer 25 has a thickness of 1~5 nm, the undoped InGaAs layer 30 has that of 10~20 nm, and the second AlGaAs spacer 30 has that of 2~10 nm. The undoped GaAs/AlGaAs capping layer 45 may be formed by stacking a GaAs layer of 20~50 nm thick and an AlGaAs layer of 20~50 nm thick.

Among the AlGaAs layer of the AlGaAs/GaAs superlattice buffer layer 15, and the AlGaAs layers of the first AlGaAs spacer 25, the second AlGaAs spacer 35, and the undoped GaAs/AlGaAs capping layer 45, a composite ratio of Al is preferably smaller than a composite ratio of Ga, e.g., 0.3 mol ratio or smaller in order to enhance quality of a grown crystal. A composite ratio of the undoped InGaAs layer 30 is preferably smaller than that of Ga, e.g., 0.25 mol ratio or smaller.

As shown in FIG. 1, the gate electrode 60 is formed as a T-type gate electrode, preferably. In case of the T-type gate electrode, because an area of the gate electrode in contact with the channel region is narrowed even though critical dimensions of the gates are equal to each other, the capacitance caused by the Schottky contact surface can be decreased. In view of an input/output characteristic of the switch device, a distance between the gate electrode 60 and the source electrode 50 preferably equals to that of the gate electrode 60 and the drain electrode 55.

In the epitaxy substrate having a double planar doping structure according to the high frequency switch device having the structure described as above, the doping density of the second Si planar doping layer 40 that is the upper plane is designed to be greater than that of the first Si planar doping layer 20 that is the lower plane, by preferably greater than 4 times. Therefore, a diffusion speed of the depletion layer is adjusted using the intensity of the electric field of the gate electrode 60 resulting from the channel depth, thereby improving not only the isolation characteristic caused by the decreased leakage current component but also the switching speed.

The high frequency switch device as shown in FIG. 1 can be manufactured in accordance with the following manufacturing method.

As shown in FIG. 1, the AlGaAs/GaAs superlattice buffer layer 15 and the first Si planar doping layer 20 are formed on the GaAs semi-insulating substrate 10. Sequentially, the undoped first AlGaAs spacer 25, the undoped InGaAs layer 30, the undoped second AlGaAs spacer 35, the second Si planar doping layer 40 with a doping density greater than that of the first Si planar doping layer 20, and the undoped GaAs/AlGaAs capping layer 45 are stacked. The obtained structure of the epitaxy substrate is optimized as previously described. In particular, the doping density of the second Si planar doping layer 40 becomes 4 times or greater than that of the first Si planar doping layer 20, which is determined by considering the decrease of the insertion loss during the on-state. For example, the doping density of the second Si planar doping layer 40 is preferably $2 \times 10^{12}$ cm$^{-2}$~$8 \times 10^{12}$ cm$^{-2}$, and that of the first Si planar doping layer 20 is preferably $0.5 \times 10^{12}$ cm$^{-2}$18 $2.0 \times 10^{12}$ cm$^{-2}$. The second AlGaAs spacer 35 is formed to be thicker than the first AlGaAs spacer 25 by twice or greater.

A metal thin film such as AuGe/Ni/Au is formed on the undoped GaAs/AlGaAs capping layer 45, which is treated by Rapid Thermal Anneal (RTA). Thus, the source electrode 50 and the drain electrode 55 are formed of forming the ohmic contact with GaAs/AlGaAs capping layer 45.

In a method of manufacturing a switch device of the conventional technique, a highly-doped capping layer was typically used in lowering the ohmic contact resistance. However, in the present invention, the source electrode 50 and the drain electrode 55, which have a low contact resistance can be formed regardless of using the undoped GaAs/AlGaAs capping layer 45. Moreover, a breakdown voltage is increased, thereby enhancing an electric power characteristic.

After forming the ohmic contact, an image reversal pattern is formed on the undoped GaAs/AlGaAs capping layer 45 using a photoresist. Then, a material that will form the gate electrode is deposited. Using lift-off, the gate electrode 60 is formed between the source electrode 50 and the drain electrode 55. In order to decrease the capacitance due to the Schottky contact surface, the gate electrode 60 is preferably formed as the T-type. In view of the input/output characteristic of the switch device, the distance between the gate electrode 60 and the source electrode 50 preferably equals to that of the gate electrode 60 and the drain electrode 55.

The present invention will now be described more fully with the unlimited experiments as set forth below. The scope of the invention without being defined by the description herein will be construed by those skilled in the art, which thus will be omitted.

Experiment 1

Figure 2:
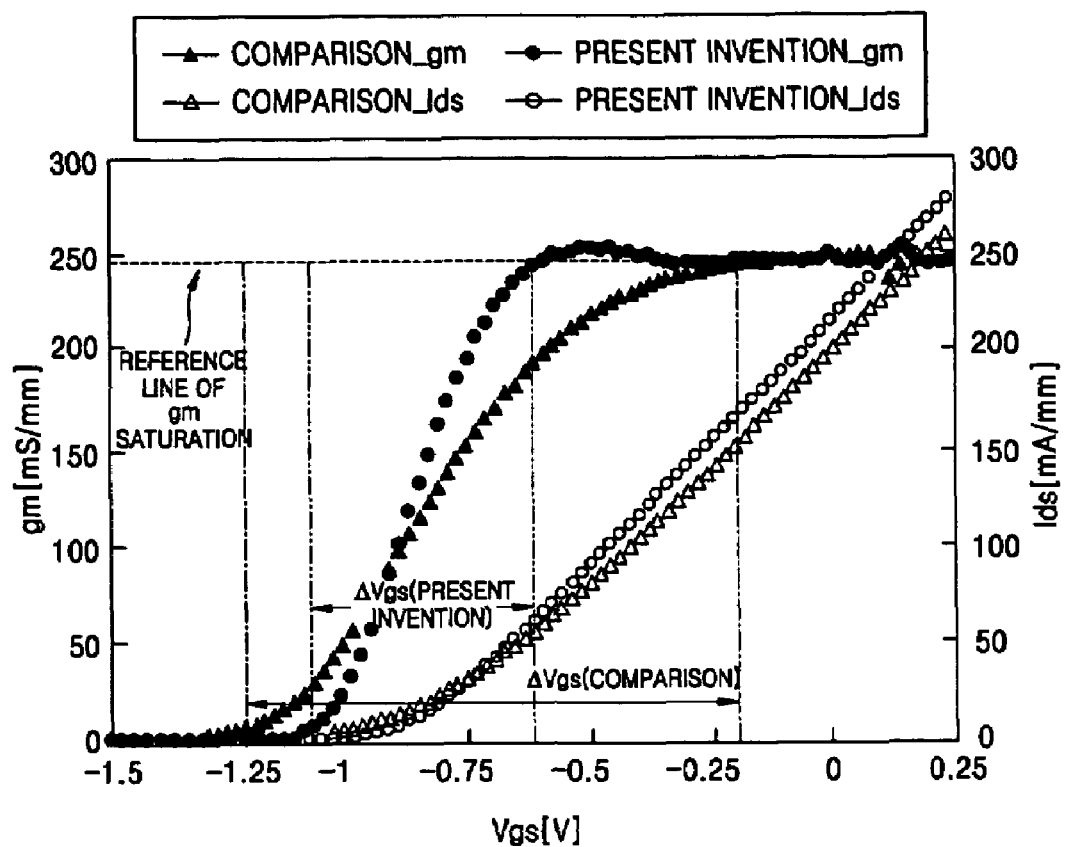
FIG. 2 depicts respective source-drain current and transconductance characteristics in view of voltages supplied to gate electrodes in the high frequency switch device according to the present invention and a switch device of comparison.

FIG. 2 depicts respective source-drain current and transconductance characteristics in view of voltages supplied to gate electrodes in the high frequency switch device according to the present invention and a switch device of a comparison.

The switch device of the comparison has a structure similar to that shown in FIG. 1, in which, however, the doping density of the second Si planar doping layer 40 is lower than or equals to that of the first Si planar doping layer 20. On the other hand, the switch device according to the present invention has the second Si planar doping layer 40 of FIG. 1, of which doping density is greater than that of the first Si planar doping layer 20 by 4 times or greater. While varying the voltages supplied to the gate electrodes of respective switch devices, the source-drain current (Ids) and the transconductance (gm) are measured.

In FIG. 2, a reference symbol -○- indicates source-drain current associated with the voltage supplied to the gate electrode, and -●- indicates the transconductance in the high frequency switch device according to the present invention, respectively. Whereas, -△- indicates the source-drain current associated with the voltage supplied to the gate electrode, and -▲- indicates the transconductance in the switch device of the comparison, respectively.

As shown in FIG. 2, in case of the switch device of the comparison, a varied amount ΔVgs (comparison) of the gate voltage required for the transconductance -▲- increased and then saturated in accordance with the increase of the gate voltage under a pinch-off state is approximately 1.1V or so. In case of the present invention, a varied amount ΔVgs (the present invention) of the voltage required for the saturated transconductance -●- is approximately 0.5V or so. The source-drain current -○- of the present invention is greater than the source-drain current -△- of the comparison.

This data denotes improvements both in the isolation characteristic due to the decrease of the leakage current component and in the switching speed (in proportion to an inclination of a curved line up to the saturation state of the transconductance under the pinch-off state) when considering the structure according to the present invention over the switch device structure of the comparison. Furthermore, the increased current of the source-drain denotes the decrease of the channel resistance, which in turn decreases the insertion loss.

Experiment 2

Figure 3A:
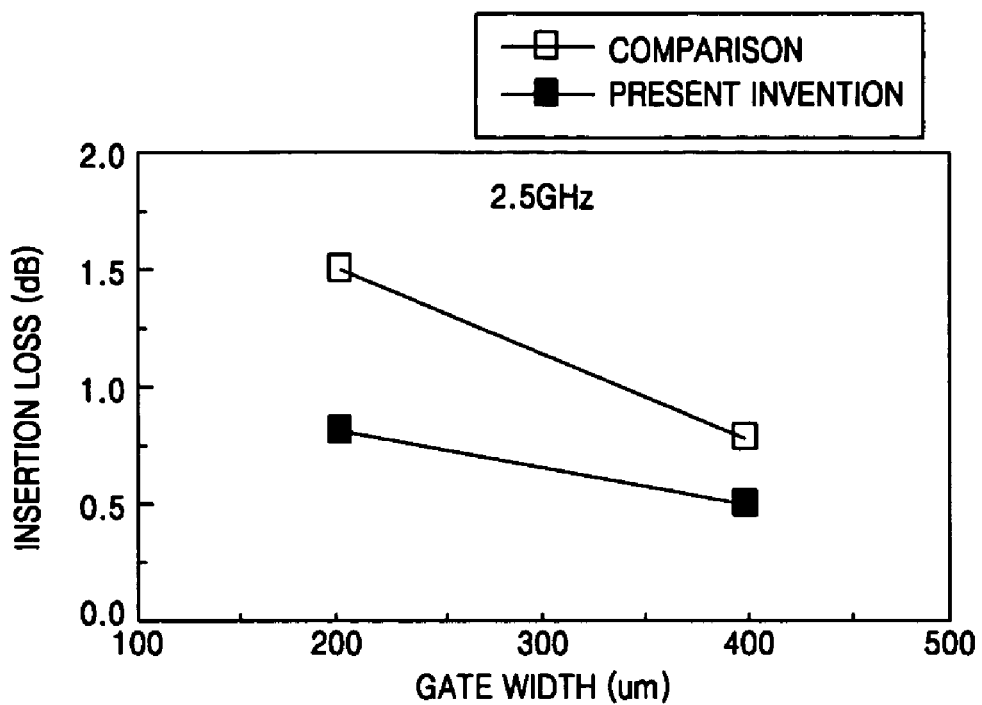
FIGS. 3A and 3B show respective insertion loss characteristics of the high frequency switch device according to the present invention and the switch device of the comparison.
Figure 3B:
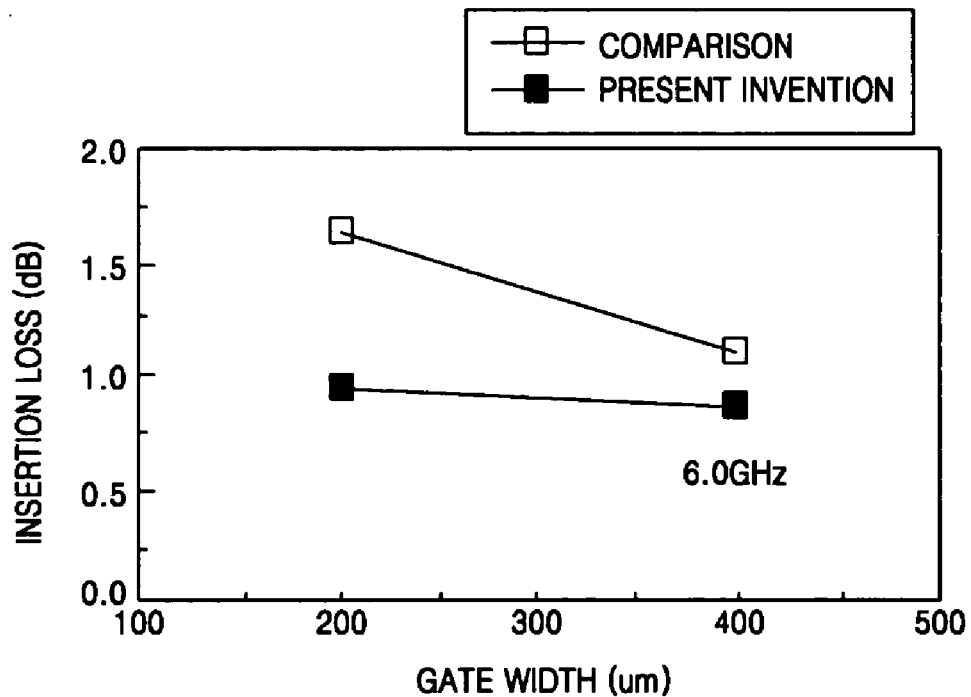

FIGS. 3A and 3B show respective insertion loss characteristics of the high frequency switch device according to the present invention and the switch device of the comparison.

The switch device of the comparison and the high frequency switch device according to the present invention as in the first experiment are prepared. Then, Single Pole Double Throw (SPDT) switch circuit (MMIC) devices are manufactured, thereby measuring the insertion loss. At this time, the widths of the gate electrodes equal to each other.

As shown in FIG. 3A, the present invention is improved as many as about 0.3 dB or greater with respect to the comparison in a high frequency band of 2.5 GHz, and as many as 0.24 dB or greater in a frequency band of 6.0 GHz as shown in FIG. 3B.

Experiment 3

Figure 4A:
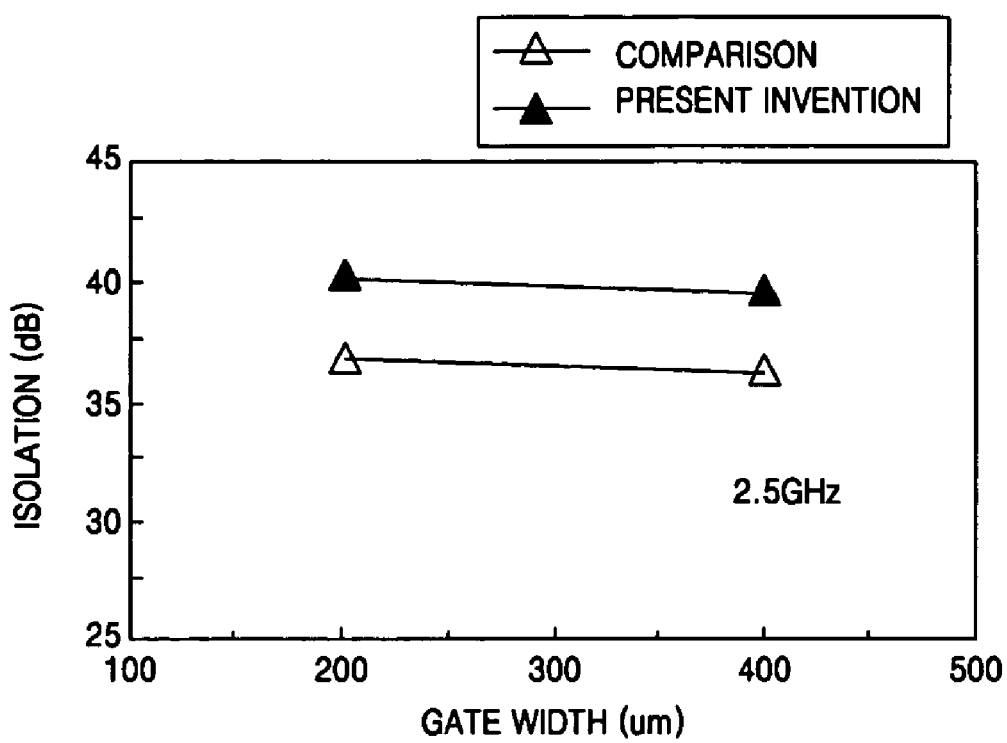
FIGS. 4A and 4B show respective isolation characteristics of the high frequency switch device according to the present invention and the switch device of comparison.
Figure 4B:
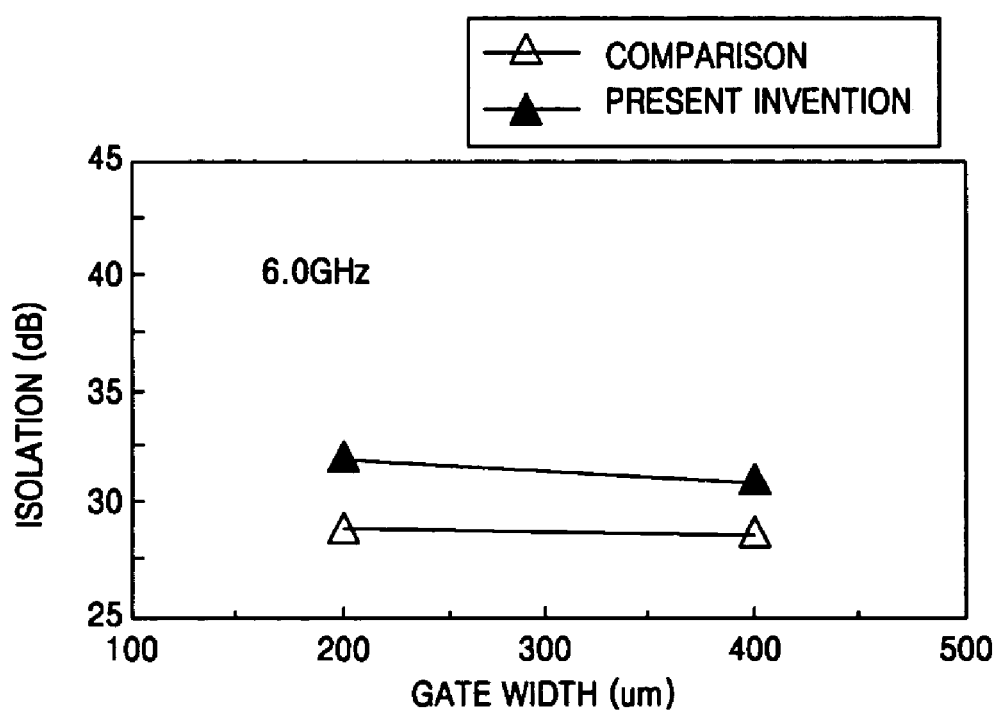

FIGS. 4A and 4B show respective isolation characteristics of the high frequency switch device according to the present invention and the switch device of the comparison.

The switch device of the comparison and the high frequency switch device according to the present invention as in the first experiment are prepared. Then, the Single Pole Double Throw (SPDT) switch circuit (MMIC) devices are manufactured, thereby measuring the isolation. At this time, the widths of the gate electrodes equal to each other.

As shown in FIG. 4A, the present invention is improved by about 3.2 dB or so with respect to the comparison in the high frequency band of 2.5 GHz, and by about 2.2 dB in the frequency band of 6.0 GHz as shown in FIG. 4B. Such an improvement of the isolation results from the adjusted doping density of the channel layer and the adjusted thickness of the interlayered spacer, which can appropriately control an expanding speed of the depletion region associated with an intensity of the electric field of the Schottky gate in view of the channel structure of the switch device. This is because of the occurrence of a steep pinch-off of the channel (i.e., off-state of the switch) like the transconductance curve of the switch device as shown in FIG. 2.

Experiment 4

When focusing on a switch device that secures the isolation by omitting a shunt FET in a high frequency band of 2.4 GHz or greater, the SPDT switch circuit (MMIC) devices respectively manufactured using the switch device according to the present invention and the switch device of the comparison are applied as shown in the experiment 1, providing that the pinch-off voltages of transistors used for the switch circuits equal to each other by −1.0V. Thus, the present invention is advantageous in securing the isolation by approximately 3 dB or so.

As described above, a switch device obtained by an optimized epitaxy substrate that has a double planar doping structure according to the present invention has advantages obtained by varying an expanding speed (in proportion to a varied rate of inclination of transconductance) of a depletion region in association with a channel depth such as increased isolation and switching speed, and decreased high electric power characteristic and insertion loss resulting from a power characteristic per unit area improved by an increased doping density of the channel depth.

Particularly, there is no need to add a shunt FET that enhances the isolation when designing the switch circuit MMIC using the switch device according to the present invention. Therefore, a chip size can be decreased, and then yield of a manufacturing process and integration thereof are enhanced, which is effective in saving manufacturing cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high frequency switch device comprising:
an epitaxy substrate formed by sequentially stacking an AlGaAs/GaAs superlattic buffer layer, a first Si planar doping layer, an undoped first AlGaAs spacer, an undoped InGaAs layer, an undoped second AlGaAs spacer, a second Si planar doping layer having a doping density greater than that of the first Si planar doping layer, and an undoped GaAs/AlGaAs capping layer on a GaAs semi-insulated substrate;

a source electrode and a drain electrode formed on the undoped GaAs/AlGaAs capping layer, thereby forming an ohmic contact with the undoped GaAs/AlGaAs capping layer; and a gate electrode formed between the source electrode and the drain electrode, thereby forming a Schottky contact with the undoped GaAs/AlGaAs capping layer.

2. The high frequency switch device as claimed in claim 1, wherein a doping density in the second Si planar doping layer is about 4 times of that in the first Si planar doping layer.

3. The high frequency switch device as claimed in claim 1, wherein a doping density of the second Si planar doping layer is $2 \times 10^{12}$ cm$^{-2}$~$8 \times 10^{12}$ cm$^{-2}$, and a doping density of the first Si planar doping layer is $0.5 \times 10^{12}$ cm$^{-2}$~$2.0 \times 10^{12}$ cm$^{-2}$.

4. The high frequency switch device as claimed in claim 1, wherein the second Si planar doping layer has a doping density greater than the first Si planar doping layer by 4 times or greater.

5. The high frequency switch device as claimed in claim 1, wherein the second AlGaAs spacer is thicker than the first AlGaAs spacer by twice or greater.

6. The high frequency switch device as claimed in claim 1, wherein the gate electrode is a T-type gate electrode.

7. The high frequency switch device as claimed in claim 1, wherein a distance between the gate electrode and the source electrode equals to a distance between the gate electrode and the drain electrode.

8. The high frequency switch device as claimed in claim 1, wherein the AlGaAs/GaAs superlattice buffer layer is formed by repeating a AlGaAs layer of 20~50 Å and a GaAs layer of 20~50 Å for 20~50 periods; a thickness of the first AlGaAs spacer is 1~5 nm, that of the undoped InGaAs layer is 10–20 nm, and that of the second AlGaAs spacer is 2~10 nm; and the undoped GaAs/AlGaAs capping layer is formed by stacking a GaAs layer of 20~50 nm and an AlGaAs layer of 20~50 nm.

9. The high frequency switch device as claimed in claim 1, wherein a composite ratio of Al is smaller than that of Ga in the AlGaAs layer from the AlGaAs/GaAs superlattice buffer layer, the first AlGaAs spacer, the second AlGaAs spacer, and the undoped GaAs/AlGaAs capping layer.

10. The high frequency switch device as claimed in claim 9, wherein the composite ratio of Al is smaller than 0.3 mol ratio.

11. The high frequency switch device as claimed in claim 1, wherein the composite ratio of In in the undoped InGaAs layer is smaller than that of Ga.

12. The high frequency switch device as claimed in claim 1, wherein the composite ratio of In is smaller than 0.25 mol ratio.

13. A high frequency switch device comprising:

an epitaxy substrate formed by sequentially stacking an AlGaAs/GaAs superlattic buffer layer, a first Si planar doping layer, an undoped first AlGaAs spacer, an undoped InGaAs layer, an undoped second AlGaAs spacer thicker than the first AlGaAs spacer by twice or greater, a second Si planar doping layer having a doping density greater than that of the first Si planar doping layer by 4 times or greater, and an undoped GaAs/AlGaAs capping layer on a GaAs semi-insulated substrate;

a source electrode and a drain electrode formed on the undoped GaAs/AlGaAs capping layer, thereby forming an ohmic contact with the undoped GaAs/AlGaAs capping layer; and a gate electrode formed between the source electrode and the drain electrode, thereby forming a Schottky contact with the undoped GaAs/AlGaAs capping layer.

* * * * *